US012610528B2

(12) United States Patent
Park et al.

(10) Patent No.: US 12,610,528 B2
(45) Date of Patent: Apr. 21, 2026

(54) SEMICONDUCTOR DEVICE

(71) Applicant: Samsung Electronics Co., Ltd.,
Suwon-si (KR)

(72) Inventors: Younglim Park, Anyang-si (KR);
Jimin Chae, Seoul (KR); **Chanhoon
Park, Suwon-si (KR); Dongmin Shin**,
Seoul (KR); Jaesoon Lim, Seoul (KR);
Intak Jeon, Seoul (KR)

(73) Assignee: **SAMSUNG ELECTRONICS CO.,
LTD.**, Suwon-si (KR)

( * ) Notice: Subject to any disclaimer, the term of this
patent is extended or adjusted under 35
U.S.C. 154(b) by 805 days.

(21) Appl. No.: 17/949,356

(22) Filed: Sep. 21, 2022

(65) Prior Publication Data

US 2023/0225112 A1      Jul. 13, 2023

(30) Foreign Application Priority Data

Jan. 7, 2022     (KR) ........................ 10-2022-0002501

(51) Int. Cl.
H10B 12/00          (2023.01)
H10D 1/00          (2025.01)
H10D 1/68          (2025.01)

(52) U.S. Cl.
CPC ......... H10B 12/315 (2023.02); H10B 12/033
(2023.02); H10B 12/34 (2023.02); **H10D
1/042 (2025.01); H10D 1/696** (2025.01);
H10D 1/716 (2025.01)

(58) Field of Classification Search
CPC .... H10B 12/315; H10B 12/033; H10B 12/34;
H10D 1/716; H10D 1/042; H10D 1/696
See application file for complete search history.

(56) References Cited

U.S. PATENT DOCUMENTS

| | | | |
|---|---|---|---|
| 6,734,479 B1* | 5/2004 | Ogishima .............. | H10B 12/05 |
| | | | 257/E21.654 |
| 10,964,614 B2 | 3/2021 | Lee et al. | |
| 11,094,778 B2 | 8/2021 | Kim et al. | |
| 11,133,314 B2 | 9/2021 | Jung et al. | |
| 2018/0175042 A1* | 6/2018 | Jang ...................... | H01L 21/321 |
| 2019/0165087 A1* | 5/2019 | Kim ........................ | H01G 4/005 |

(Continued)

FOREIGN PATENT DOCUMENTS

TW          201025516 A      7/2010

*Primary Examiner* — Michael Jung
(74) *Attorney, Agent, or Firm* — Muir Patent Law, PLLC

(57)          ABSTRACT

A semiconductor device including a substrate, lower electrodes disposed on the substrate, at least one support layer in contact with the lower electrodes, a dielectric layer disposed on the lower electrodes, an upper electrode disposed on the dielectric layer, a first interfacial film between the lower electrodes and the dielectric layer, and a second interfacial film between the upper electrode and the dielectric layer. At least one of the first and second interfacial films includes a plurality of layers, wherein the plurality of layers include a first metal element, and a second metal element, and at least one of oxygen \and nitrogen. The lower electrodes include the first metal element. A first region of the first interfacial film includes the second metal element at a first concentration and a second region of the first interfacial film includes the second metal element at a second concentration different from the first concentration.

20 Claims, 14 Drawing Sheets

(56)                    References Cited

U.S. PATENT DOCUMENTS

| | | | |
|---|---|---|---|
| 2019/0259951 | A1 | 8/2019 | Seong et al. |
| 2019/0393222 | A1* | 12/2019 | Sharma ................ H10B 12/318 |
| 2020/0091275 | A1* | 3/2020 | Kim ....................... H10D 1/716 |
| 2020/0105633 | A1 | 4/2020 | Lee et al. |
| 2021/0066446 | A1 | 3/2021 | Lee et al. |
| 2021/0134803 | A1 | 5/2021 | Cho et al. |
| 2021/0257371 | A1 | 8/2021 | Son et al. |
| 2021/0272961 | A1* | 9/2021 | Tung ..................... H10B 12/34 |
| 2022/0328487 | A1* | 10/2022 | Kimura ................ G11C 11/405 |
| 2023/0171943 | A1* | 6/2023 | Yang ................ H10B 12/0335 |
| | | | 257/296 |

\* cited by examiner

100

SEMICONDUCTOR DEVICE

CROSS-REFERENCE TO RELATED APPLICATION

This application claims priority under 35 U.S.C. § 119 to Korean Patent Application No. 10-2022-0002501, filed on Jan. 7, 2022, with the Korean Intellectual Property Office, the disclosure of which is incorporated herein by reference in its entirety.

BACKGROUND

1. Field

The present inventive concept relates to a semiconductor device.

2. Description of Related Art

In accordance with the demand for high integration and miniaturization of a semiconductor device, a size of a capacitor of the semiconductor device may also be miniaturized. Accordingly, various studies have been undertaken to optimize a structure of a capacitor capable of storing information in a dynamic random-access memory (DRAM).

SUMMARY

An aspect of the present inventive concept provides a semiconductor device having improved electrical characteristics and reliability.

According to an aspect of the present inventive concept, a semiconductor device, may include: a substrate extending in a first direction and a second direction intersecting the first direction; a plurality of lower electrodes on the substrate; at least one support layer in contact with the plurality of lower electrodes and extending in the first direction, parallel to an upper surface of the substrate; a dielectric layer on the plurality of lower electrodes; an upper electrode on the dielectric layer; a first interfacial film between the plurality of lower electrodes and the dielectric layer; and a second interfacial film between the upper electrode and the dielectric layer, wherein at least one of the first interfacial film and the second interfacial film includes a plurality of layers, wherein each of an upper surface and a lower surface of the at least one support layer comprises a region, spaced apart from the first interfacial film, wherein the plurality of layers include a first metal element, and a second metal element, different from the first metal element, and at least one of oxygen (O) and nitrogen (N), wherein the plurality of lower electrodes include the first metal element, wherein the first interfacial film comprises a first region and a second region, the first region being more adjacent to the at least one support layer than the second region in a third direction perpendicular to the first and second directions, wherein, in the first region, the first interfacial film includes the second metal element at a first concentration, and wherein, in the second region, the first interfacial film includes the second metal element at a second concentration different from the first concentration.

According to an aspect of the present inventive concept, a semiconductor device, may include: a substrate extending in a first direction and a second direction intersecting the first direction; a plurality of lower electrodes on the substrate; a support layer in contact with the plurality of lower electrodes and extending in the first direction parallel to an upper surface of the substrate; a dielectric layer on the plurality of lower electrodes; an upper electrode on the dielectric layer; a first interfacial film between the plurality of lower electrodes and the dielectric layer; and a second interfacial film between the upper electrode and the dielectric layer, wherein at least one of the first interfacial film and the second interfacial film includes a plurality of layers, wherein a thickness of a portion of the first interfacial film decreases in the first direction as the first interfacial film extends in a third direction towards the support layer, the third direction perpendicular to the first and second directions.

According to an aspect of the present inventive concept, a semiconductor device, may include: a device isolation layer defining active regions on a substrate extending in a first direction and a second direction intersecting the first direction; gate electrodes across the active regions and extending into the device isolation layer; first impurity regions and second impurity regions in the active regions on both sides of the gate electrodes; bit lines on the gate electrodes, and electrically connected to the first impurity regions; upper conductive patterns on side surfaces of the bit lines, and electrically connected to the second impurity regions; lower electrodes extending in a third direction, perpendicular to the first and second directions, on the upper conductive patterns, and connected to the upper conductive patterns, the lower electrodes including a first electrode pattern and a second electrode pattern, adjacent to each other; at least one support layer between the first electrode pattern and the second electrode pattern, and in contact with the first electrode pattern and the second electrode pattern; an upper electrode on the lower electrodes; a dielectric layer between the lower electrodes and the upper electrode; a first interfacial film between the lower electrodes and the dielectric layer; and a second interfacial film between the upper electrode and the dielectric layer, wherein each of an upper surface and a lower surface of the at least one support layer includes a portion exposed from the first interfacial film and in contact with the dielectric layer, wherein at least one of the first interfacial film and the second interfacial film includes a plurality of layers, wherein the lower electrodes, the upper electrode, the first interfacial film, and the second interfacial film include a first metal element in common, wherein the first interfacial film includes a second metal element, different from the first metal element, and wherein the first interfacial film includes a portion of which a concentration of the second metal element decreases in the third direction towards the at least one support layer.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Hereinafter, preferred embodiments of the present inventive concept will be described with reference to the accompanying drawings.

Figure 1:
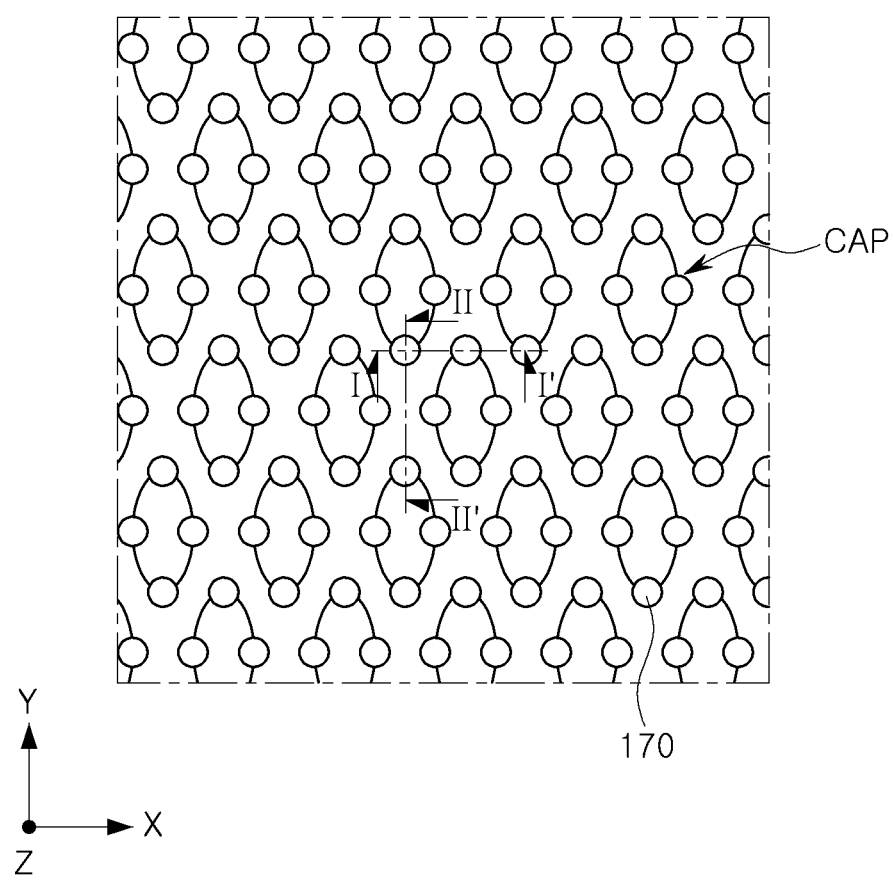
FIG. 1 is a schematic plan view of a semiconductor device according to example embodiments.

FIG. 1 is a schematic plan view of a semiconductor device according to example embodiments.

Figure 2:
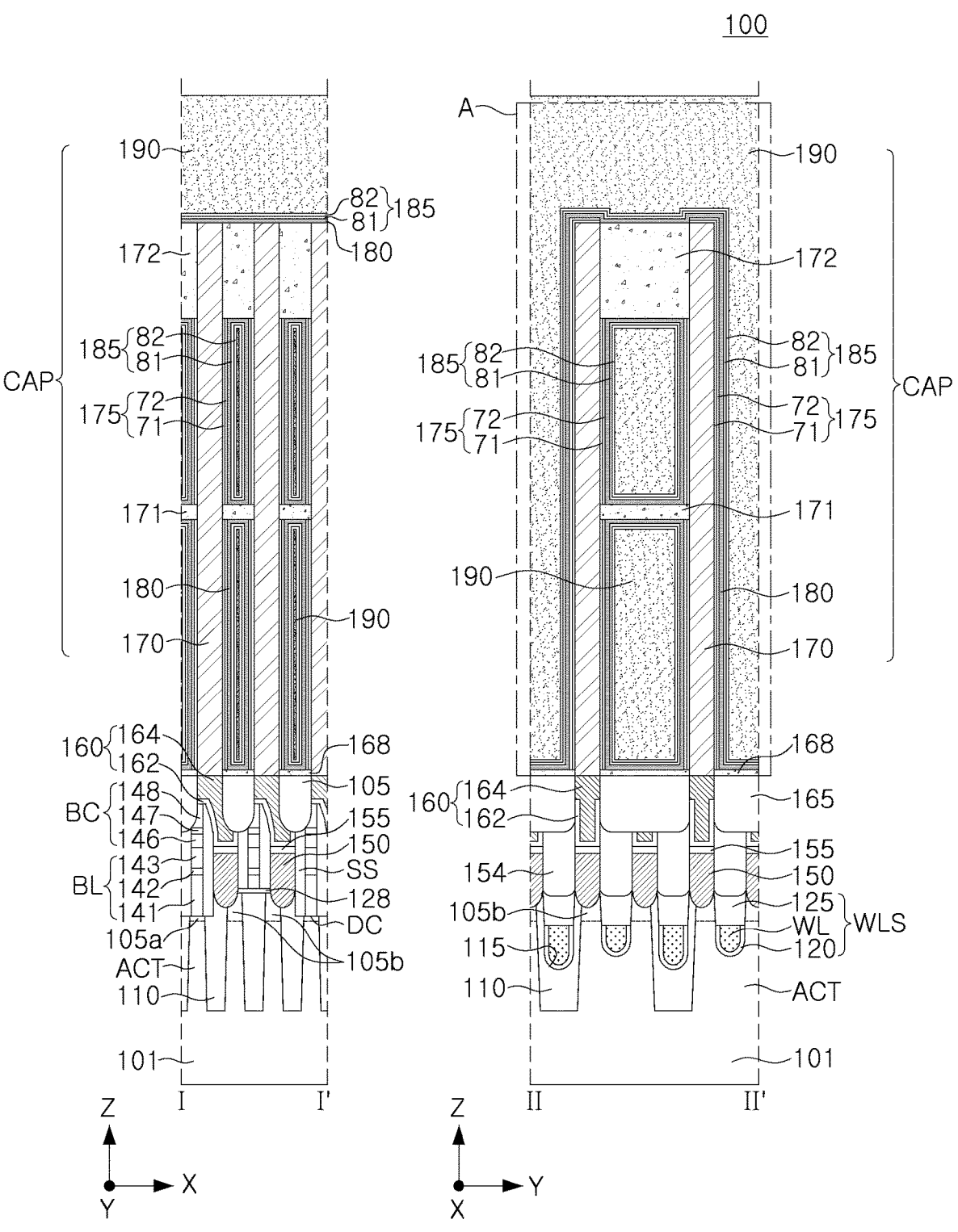
FIG. 2 is a schematic cross-sectional view of a semiconductor device according to example embodiments.

FIG. 2 is a schematic cross-sectional view of a semiconductor device according to example embodiments. FIG. 2 illustrates cross-sections of the semiconductor device of FIG. 1 along cutting lines I-I' and II-II'.

Figure 3:
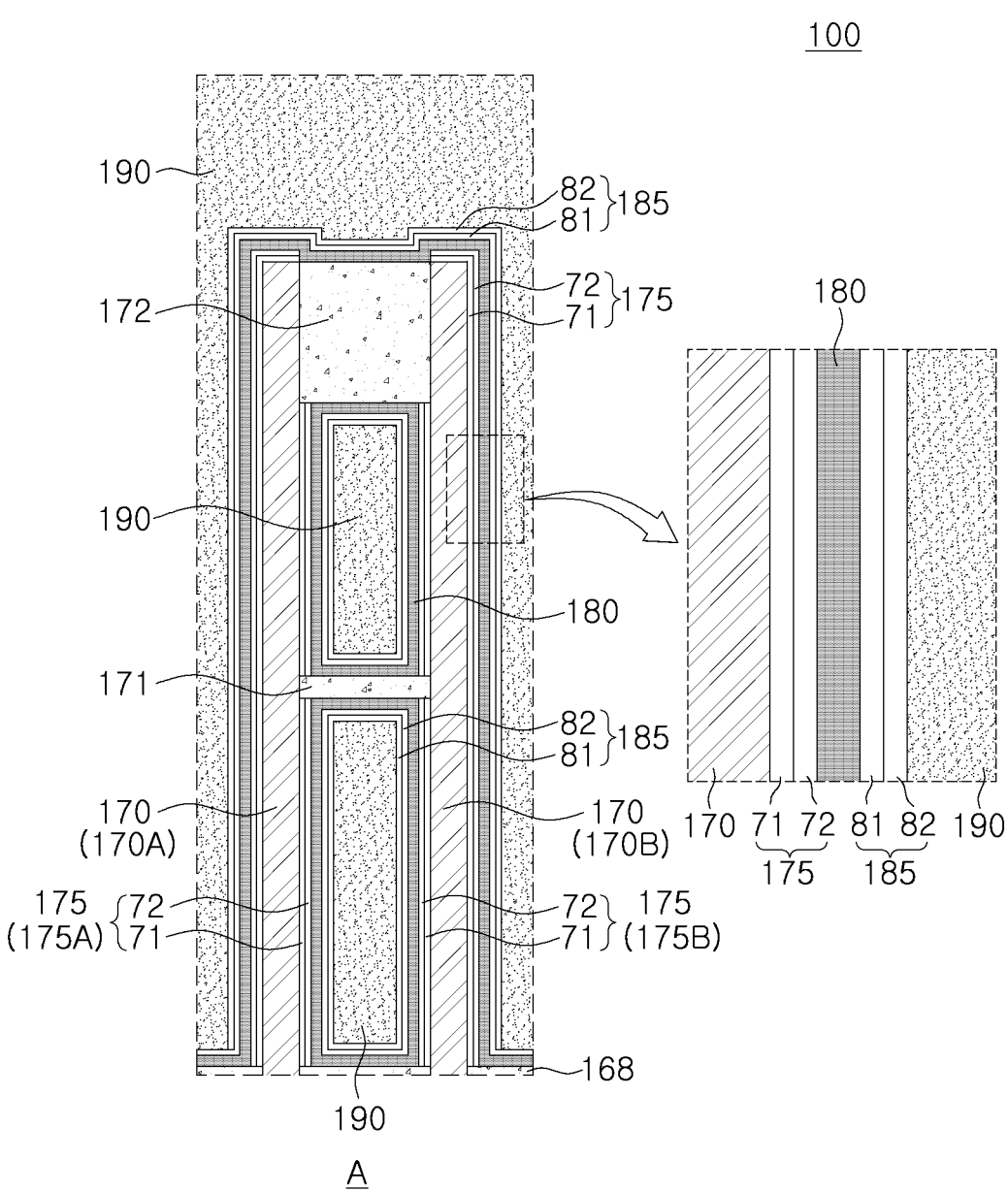
FIGS. 3 to 6 are partially enlarged cross-sectional views illustrating a region including a capacitor of a semiconductor device according to example embodiments.

FIG. 3 is a partially enlarged cross-sectional view illustrating a region including a capacitor of a semiconductor device according to example embodiments. FIG. 3 is an enlarged view of region 'A' of FIG. 2.

Referring to FIGS. 1 to 3, a semiconductor device 100 may include a substrate 101 including active regions ACT, a device isolation layer 110 defining the active regions ACT in the substrate 101, a word line structure WLS extending buried in the substrate 101 and including a word line WL, a bit line structure BLS extending across the word line structure WLS on the substrate 101 and including a bit line BL, and a capacitor structure CAP on the bit line structure BLS. The semiconductor device 100 may further include a lower conductive pattern 150 on the active region ACT, an upper conductive pattern 160 on the lower conductive pattern 150, and an insulating pattern 165 penetrating through the upper conductive pattern 160.

The semiconductor device 100 may include, for example, a cell array of a dynamic random access memory (DRAM). For example, the bit line BL may be connected to a first impurity region 105*a* of the active region ACT, and a second impurity region 105*b* of the active region ACT may be electrically connected to a capacitor structure CAP on the upper conductive pattern 160 through the lower and upper conductive patterns 150 and 160. The capacitor structure CAP may include lower electrodes 170, a dielectric layer 180 on the lower electrodes 170, an upper electrode 190 on the dielectric layer 180, a first interfacial film 175 interposed between the lower electrodes 170 and the dielectric layer 180, and a second interfacial film 185 between the upper electrode 190 and the dielectric layer 180. The capacitor structure CAP may further include an etch stop layer 168 and support layers 171 and 172.

The semiconductor device 100 may include a cell array region in which a cell array is disposed and a peripheral circuit region in which peripheral circuits for driving memory cells disposed in the cell array region. The peripheral circuit region may be disposed around the cell array region.

The substrate 101 may include a semiconductor material, for example, a group IV semiconductor, a group III-V compound semiconductor, or a group II-VI compound semiconductor. For example, the group IV semiconductor may include or may be formed of silicon, germanium, or silicon-germanium. The substrate 101 may further include impurities. The substrate 101 may be a substrate including a silicon substrate, a silicon-on insulator (SOI) substrate, a germanium substrate, a germanium-on insulator (GOI) substrate, a silicon-germanium substrate, or an epitaxial layer.

The active regions ACT may be defined in the substrate 101 by the device isolation layer 110. The active region ACT may have a bar shape, and may be disposed in an island shape extending in one direction in the substrate 101. The one direction may be a direction, inclined with respect to a direction in which the word lines extend WL and a direction in which the bit lines BL extend. The active regions ACT may be arranged parallel to each other, and an end portion of one active region ACT may be arranged adjacent to a center of the other active region ACT, adjacent thereto.

The active region ACT may have first and second impurity regions 105*a* and 105*b* having a predetermined depth from the upper surface of the substrate 101. The first and second impurity regions 105*a* and 105*b* may be spaced apart from (e.g., not in contact with) each other. The first and second impurity regions 105*a* and 105*b* may be connected to a source/drain region of a transistor formed by the word line WL. The source region and the drain region may be formed by the first and second impurity regions 105*a* and 105*b* by doping or ion implantation with substantially the same impurities, and may be interchanged depending on a circuit configuration of the finally formed transistor. The impurities may include dopants having a conductivity-type, opposite to that of the substrate 101. In example embodiments, depths of the first and second impurity regions 105*a* and 105*b* in the source region and the drain region may be different from each other.

The device isolation layer 110 may be formed by a shallow trench isolation (STI) process. The device isolation layer 110 may surround the active regions ACT and may electrically isolate the same from each other. The device isolation layer 110 may be made of an insulating material, and for example, silicon oxide, silicon nitride, or a combination thereof. The device isolation layer 110 may include a plurality of regions having different lower depths according to a width of a trench in which the substrate 101 is etched.

The word line structures WLS may be disposed in gate trenches 115 extending in the substrate 101. Each of the word line structures WLS may include a gate dielectric layer 120, a word line WL, and a gate capping layer 125. In the present specification, the gate 120 WL may be referred to as a structure including the gate dielectric layer 120 and the word line WL, the word line WL may be referred to as a 'gate electrode', and the word line structure WLS may be referred to as a 'gate structure'.

The word line WL may be disposed to extend in a first direction X across the active region ACT. For example, a pair of word lines WL, adjacent to each other, may be disposed to cross one active area ACT. The word line WL may constitute a gate of a buried channel array transistor (BCAT), but an example embodiment thereof is not limited thereto. In some example embodiments, the word lines WL may be disposed above the substrate 101. The word line WL may be disposed in the gate trench 115 to have a predetermined thickness less than a depth of the gate trench. An upper surface of the word line WL may be positioned at a level lower than an upper surface of the substrate 101. In the present specification, highness and lowness of a term "level" may be defined based on a substantially flat upper surface of the substrate 101. Spatially relative terms, such as "beneath," "below," "lower," "above," "upper" and the like, may be used herein for ease of description to describe positional relationships. It will be understood that the spatially relative terms encompass different orientations of the device in addition to the orientation depicted in the figures.

The word line WL may include a conductive material, for example, at least one of polycrystalline silicon (Si), titanium (Ti), titanium nitride (TiN), tantalum (Ta), tantalum nitride (TaN), tungsten (W), tungsten nitride (WN), and aluminum (Al). For example, the word line WL may include a lower pattern and an upper pattern formed of different materials, and the lower pattern may include or may be formed of at least one of tungsten (W), titanium (Ti), tantalum (Ta), or tungsten nitride (WN), titanium nitride (TiN), and tantalum nitride (TaN), and the upper pattern may be a semiconductor pattern including polysilicon doped with P-type or N-type impurities.

The gate dielectric layer 120 may be disposed on a bottom surface and inner side surfaces of the gate trench 115. The gate dielectric layer 120 may conformally cover the inner side wall of the gate trench 115. The gate dielectric layer 120 may include or may be formed of at least one of silicon oxide, silicon nitride, and silicon oxynitride. The gate dielectric layer 120 may be, for example, a silicon oxide film or an insulating film having a high dielectric constant. In example embodiments, the gate dielectric layer 120 may be a layer formed by oxidizing the active region ACT or a layer formed by deposition.

The gate capping layer 125 may be disposed above the word line WL to fill the gate trench 115. An upper surface of the gate capping layer 125 may be positioned at substantially the same level as the upper surface of the substrate 101. The gate capping layer 125 may be formed of an insulating material, for example, silicon nitride. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The bit line structure BLS may extend in one direction, for example, a second direction Y, perpendicular to the word line WL. The bit line structure BLS may include a bit line BL and a bit line capping pattern BC on the bit line BL.

The bit line BL may include a first conductive pattern 141, a second conductive pattern 142, and a third conductive pattern 143 that are sequentially stacked. The bit line capping pattern BC may be disposed on the third conductive pattern 143. A buffer insulating layer 128 may be disposed between the first conductive pattern 141 and the substrate 101, and a portion of the first conductive pattern 141 (hereinafter, a bit line contact pattern DC) may be in contact with a first impurity region 105a of the active region ACT. The bit line BL may be electrically connected to the first impurity region 105a through the bit line contact pattern DC. A lower surface of the bit line contact pattern DC may be positioned at a level lower than the upper surface of the substrate 101, and may be positioned at a higher level than the upper surface of the word line WL. In an example embodiment, the bit line contact pattern DC may be formed in the substrate 101 to be locally disposed in a bit line contact hole exposing the first impurity region 105a.

The first conductive pattern 141 may include a semiconductor material such as polycrystalline silicon. The first conductive pattern 141 may be in contact with the first impurity region 105a. The second conductive pattern 142 may include a metal-semiconductor compound. The metal-semiconductor compound may be, for example, a layer in which a portion of the first conductive pattern 141 is formed of or includes silicide. For example, the metal-semiconductor compound may include cobalt silicide (CoSi), titanium silicide (TiSi), nickel silicide (NiSi), tungsten silicide (WSi), or other metal silicide. The third conductive pattern 143 may include a metal material such as titanium (Ti), tantalum (Ta), tungsten (W), and aluminum (Al). The number of conductive patterns constituting the bit line BL, the type of material, and/or the stacking order may be variously changed according to example embodiments. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The bit line capping pattern BC may include a first capping pattern 146, a second capping pattern 147, and a third capping pattern 148 sequentially stacked on the third conductive pattern 143. Each of the first to third capping patterns 146, 147, and 148 may include or may be formed of an insulating material, for example, a silicon nitride layer. The first to third capping patterns 146, 147, and 148 may be formed of different materials, and even if they include the same material, boundaries may be distinguished by differences in physical properties. A thickness of the second capping pattern 147 may be smaller than a thickness of the first capping pattern 146 and a thickness of the third capping pattern 148, respectively. The number of capping patterns and/or the type of material constituting the bit line capping pattern BC may be variously changed according to example embodiments.

The spacer structures SS may be disposed on both sidewalls of each of the bit line structure BLS to extend in one direction, for example, a Y direction. The spacer structures SS may be disposed between the bit line structure BLS and the lower conductive pattern 150. The spacer structures SS may be disposed to extend along sidewalls of the bit line BL and sidewalls of the bit line capping pattern BC. A pair of spacer structures SS disposed on both sides of one bit line structure BLS may have an asymmetric shape with respect to the bit line structure BLS. Each of the spacer structures SS may include a plurality of spacer layers, and may further include an air spacer according to example embodiments.

A lower conductive pattern 150 may be connected to one region of the active region ACT, for example, a second impurity region 105b. The lower conductive pattern 150 may be disposed between bit lines BL and word lines WL. The lower conductive pattern 150 may penetrate a buffer insulating layer 128, and connected to a second impurity region 105b of the active region ACT. The lower conductive pattern 150 may be in contact with the second impurity region 105b. A lower surface of the lower conductive pattern 150 may be located at a level lower than an upper surface of the substrate 101, and may be located at a higher level than a lower surface of a bit line contact pattern DC. The lower conductive pattern 150 may be insulated from the bit line contact pattern DC by the spacer structure SS. The lower conductive pattern 150 may be formed of a conductive material. For example, the lower conductive pattern 150 may be formed or may include at least one of polycrystalline silicon (Si), titanium (Ti), titanium nitride (TiN), tantalum (Ta), tantalum nitride (TaN), tungsten (W), tungsten nitride (WN), and aluminum (Al). In an example embodiment, the lower conductive pattern 150 may include a plurality of layers.

A metal-semiconductor compound layer 155 may be disposed between the lower conductive pattern 150 and the upper conductive pattern 160. The metal-semiconductor compound layer 155 may be, for example, a layer in which a portion of the lower conductive pattern 150 is formed of or includes silicide when the lower conductive pattern 150 includes a semiconductor material. The metal-semiconductor compound layer 155 may include, for example, cobalt silicide (CoSi), titanium silicide (TiSi), nickel silicide (NiSi), tungsten silicide (WSi), or other metal silicide. In some example embodiments, the metal-semiconductor compound layer 155 may be omitted.

The upper conductive pattern 160 may be disposed on the lower conductive pattern 150. The upper conductive pattern 160 may extend between the spacer structures SS to cover an upper surface of the metal-semiconductor compound layer 155. The upper conductive pattern 160 may include a barrier layer 162 and a conductive layer 164. The barrier layer 162 may cover a lower surface and side surfaces of the conductive layer 164. The barrier layer 162 may include or may be formed of a metal nitride, for example, at least one of titanium nitride (TiN), tantalum nitride (TaN), and tungsten nitride (WN). The conductive layer 164 may include or may be formed of a conductive material, for example, at least one of polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), and tungsten nitride (WN).

Insulating patterns 165 may be disposed to penetrate an upper conductive pattern 160. The upper conductive pattern 160 may be separated by the insulating patterns 165. The insulating patterns 165 may include or may be formed of an insulating material, for example, at least one of silicon oxide, silicon nitride, and silicon oxynitride.

The capacitor structure CAP will be described in detail below with reference to FIG. 3.

The etch stop layer 168 may cover the insulating patterns 165 between the lower electrodes 170. The etch stop layer 168 may be in contact with lower regions of side surfaces of the lower electrodes 170. The etch stop layer 168 may be disposed at level lower than the support layers 171 and 172. An upper surface of the etch stop layer 168 may include a portion exposed from (i.e., not covered by) the first interfacial film 175 to thereby be in contact with the dielectric layer 180. The etch stop layer 168 may include or may be formed of, for example, at least one of silicon nitride and silicon oxynitride.

The lower electrodes 170 may be disposed on the upper conductive patterns 160. The lower electrodes 170 may penetrate the etch stop layer 168 to be in contact with the upper conductive patterns 160. The lower electrodes 170 may have a cylindrical shape or a hollow cylinder or cup shape. At least one of support layers 171 and 172 supporting the lower electrodes 170 may be provided between the adjacent lower electrodes 170. For example, as shown in FIG. 3, a first support layer 171 and a second support layer 172, in contact with the first electrode pattern 170A and the second electrode pattern 170B, may be provided between the first electrode pattern 170A and the second electrode pattern 170B, adjacent to each other among the lower electrodes 170. Each of the lower electrodes 170 may include or may be formed of at least one of polycrystalline silicon (Si), titanium (Ti), titanium nitride (TiN), tantalum (Ta), tantalum nitride (TaN), tungsten (W), tungsten nitride (WN), and aluminum (Al).

The support layers 171 and 172 may include a first support layer 171 and a second support layer 172 on the first support layer 171. The support layers 171 and 172 may contact the lower electrodes 170, and extend in a direction, parallel to an upper surface of the substrate 101. Each of upper and lower surfaces of the support layers 171 and 172 may include a region spaced apart from the first interfacial film 175. For example, each of the upper and lower surfaces of the support layers 171 and 172 may include a portion, exposed from (e.g., not covered by, spaced apart from, or not in contact with) the first interfacial film 175 and in contact with the dielectric layer 180. The second support layer 172 may have a thickness greater than that of the first support layer 171, but an example embodiment thereof is not limited thereto. The support layers 171 and 172 may be layers supporting the lower electrodes 170 having a high aspect ratio. Each of the support layers 171 and 172 may include, for example, at least one of silicon nitride and silicon oxynitride, or a material similar thereto. The number, thickness, and/or dispositional relationship of the support layers 171 and 172 are not limited to the illustrated ones, and may be variously changed according to example embodiments.

The dielectric layer 180 may cover a first interfacial film 185 formed on surfaces of the lower electrodes 170. The dielectric layer 180 may be disposed between the first interfacial film 175 and the second interfacial film 185. The dielectric layer 180 may cover a portion exposed from the first interfacial film 175 on an upper surface and a lower surface of each of the support layers 171 and 172. The dielectric layer 180 may cover a portion of the upper surface of the etch stop layer 168 exposed from the first interfacial film 175. The dielectric layer 180 may contact at least a portion of each of the upper and lower surfaces of the support layers 171 and 172. The dielectric layer 180 may include a high dielectric material or silicon oxide, silicon nitride, silicon oxynitride, or a combination thereof. However, in some example embodiments, the dielectric layer 180 may include an oxide, nitride, silicide, oxynitride, or silicon oxynitride including one of hafnium (Hf), aluminum (Al), zirconium (Zr), and lanthanum (La). The dielectric layer 180 may be disposed between the first interfacial film 175 and the second interfacial film 185. The dielectric layer 180 may also contact the first interfacial film 175 and the second interfacial film 185. By forming the first interfacial film 175 and the second interfacial film 185, a leakage current may be reduced inside a capacitor structure CAP, and may increase capacitance of the capacitor structure CAP.

The first interfacial film 175 may be disposed between the lower electrodes 170 and the dielectric layer 180 to conformally extend along surfaces of the lower electrodes 170. However, the first interfacial film 175 may intermittently extend around the etch stop layer 168 and the support layers 171 and 172. For example, the first interfacial film 175 may not extend horizontally (e.g., in the X-direction) along the upper and lower surfaces of the support layers 171 and 172. The first interfacial film 175 may include a first interfacial pattern 175A in contact with a first electrode pattern 170A, and a second interfacial pattern 175B, in contact with a second electrode pattern 170B. The first interfacial pattern 175A and the second interfacial pattern 175B may be disposed between the first electrode pattern 170A and the second electrode pattern 170B and spaced apart from each other in a horizontal direction. The first interfacial pattern 175A and the second interfacial pattern 175B may be disposed between the etch stop layer 168 and the first support layer 171 and between the first support layer 171 and the second support layer 172.

The first interfacial film 175 may include a plurality of layers 71 and 72. Each of the plurality of layers 71 and 72 may include or may be formed of a metal, a metal nitride, a metal oxide, or a metal oxynitride. The plurality of layers 71 and 72 may include, for example, a first layer 71 and a second layer 72 including different metal elements as a central metal element, and in common, at least one of oxygen (O) and nitrogen (N). The first layer 71 may be formed of a first metal element, and the second layer 72 may be formed of a second metal element, different from the first metal element, and the second metal element may be diffused by substitution with the first metal element during a process of forming the first interfacial film 175. The first metal element may be the same as the central metal element constituting the lower electrodes 170. Each of the first metal element and the second metal element may correspond to any one of tin (Sn), molybdenum (Mo), niobium (Nb), tantalum (Ta), titanium (Ti), indium (In), nickel (Ni), cobalt (Co), tungsten (W), ruthenium (Ru), zirconium (Zr), and hafnium (Hf). An interface between the plurality of layers 71 and 72 may be distinguished, but when it is difficult to distinguish the interface, the type and concentration distribution (or profile) of the elements included in the plurality of layers 71 and 72 may be confirmed through an energy dispersive X-ray spectroscopy (EDS), an X-ray fluorescence (XRF) analysis method, an X-ray photoelectron spectrometry (XPS) method, a secondary ion mass spectrometry (SIMS) method, or the like. Since the first layer 71 and the second layer 72 have a thin thickness of each layer and material diffusion occurs therein, even if it is difficult to distinguish an interface between the first layer 71 and the second layer 72, at least three or at least four elements may be detected in the first interfacial film 175.

The first interfacial film 175 may be formed of a plurality of layers 71 and 72, and diffusion by mutual substitution of the first metal element and the second metal element may occur relatively less in a region in which the first interfacial film 175 is adjacent to the etch stop layer 168 and the support layers 171 and 172. Accordingly, the concentration of the second metal element included in the first interfacial film 175 may decrease in a direction towards the etch stop layer 168 and the support layers 171 and 172. For example, the first interfacial film 175 may include a first region and a second region, wherein the first region is more adjacent to the support layers 171 and 172 than the second region In the first region, the first interfacial film 175 may include the second metal element at a first concentration. In the second region, the first interfacial film 175 may include the second metal element at a second concentration, and the first concentration may be less than the second concentration.

When the first interfacial film 175 is formed of the plurality of layers 71 and 72 due to diffusion between metal materials, the first interfacial film 175 may have etch resistance against selective etching for subsequent node separation. For example, the etch resistance of the first interfacial film 175 in a region adjacent to the lower electrodes 170 including the first metal element may be higher than the etch resistance of the first interfacial film 175 formed around the support layers 171 and 172. Accordingly, during a selective etching process, a portion of the first interfacial film 175 may be left on the lower electrodes 170 and a portion of the first interfacial film 175 may be selectively removed on the support layers 171 and 172 and the etch stop layer 168. That is, when the first interfacial film 175 is formed in a plurality of layers, selective etching may be performed more easily than when the first interfacial film 175 is formed in a single layer, so that occurrence of an electrical bridge between the lower electrodes 170 may be reduced, and the first interfacial film 175 may remain on surfaces of the lower electrodes 170 to improve electrical characteristics of the capacitor structure CAP.

In one example, the lower electrodes 170 may include an oxide region oxidized from a surface, adjacent to the first interfacial film 175. For example, the lower electrodes 170 may be formed of titanium nitride (TiN), and may include titanium oxynitride (TiON) in a region adjacent to the first interfacial film 175.

The second interfacial film 185 may conformally extend along a surface of the dielectric layer 180. The second interfacial film 185 may extend continuously around the etch stop layer 168 and the support layers 171 and 172. For example, the second interfacial film 185 may include a horizontally extending portion in a region, adjacent to the support layers 171 and 172.

The second interfacial film 185 may include a plurality of layers 81 and 82. Each of the plurality of layers 81 and 82 may include a metal, a metal nitride, a metal oxide, or a metal oxynitride. The plurality of layers 81 and 82 may include, for example, a first layer 81 and a second layer 82 including different metal elements as central metal elements, and in common, may include at least one of oxygen (O) nitrogen (N). The metal element of each of the first layer 81 and the second layer 82 may correspond to any one of tin (Sn), molybdenum (Mo), niobium (Nb), tantalum (Ta), titanium (Ti), and indium. (In), nickel (Ni), cobalt (Co), tungsten (W), ruthenium (Ru), zirconium (Zr), and hafnium (Hf). The second interfacial film 185 may cover an entire surface of the dielectric layer 180, and the upper electrode 190 may cover an entire surface of the second interfacial film 185, thereby reducing leakage current inside the capacitor structure CAP, and increasing capacitance of the capacitor structure CAP. Accordingly, the electrical characteristics of the capacitor structure CAP may be improved.

Figure 4:
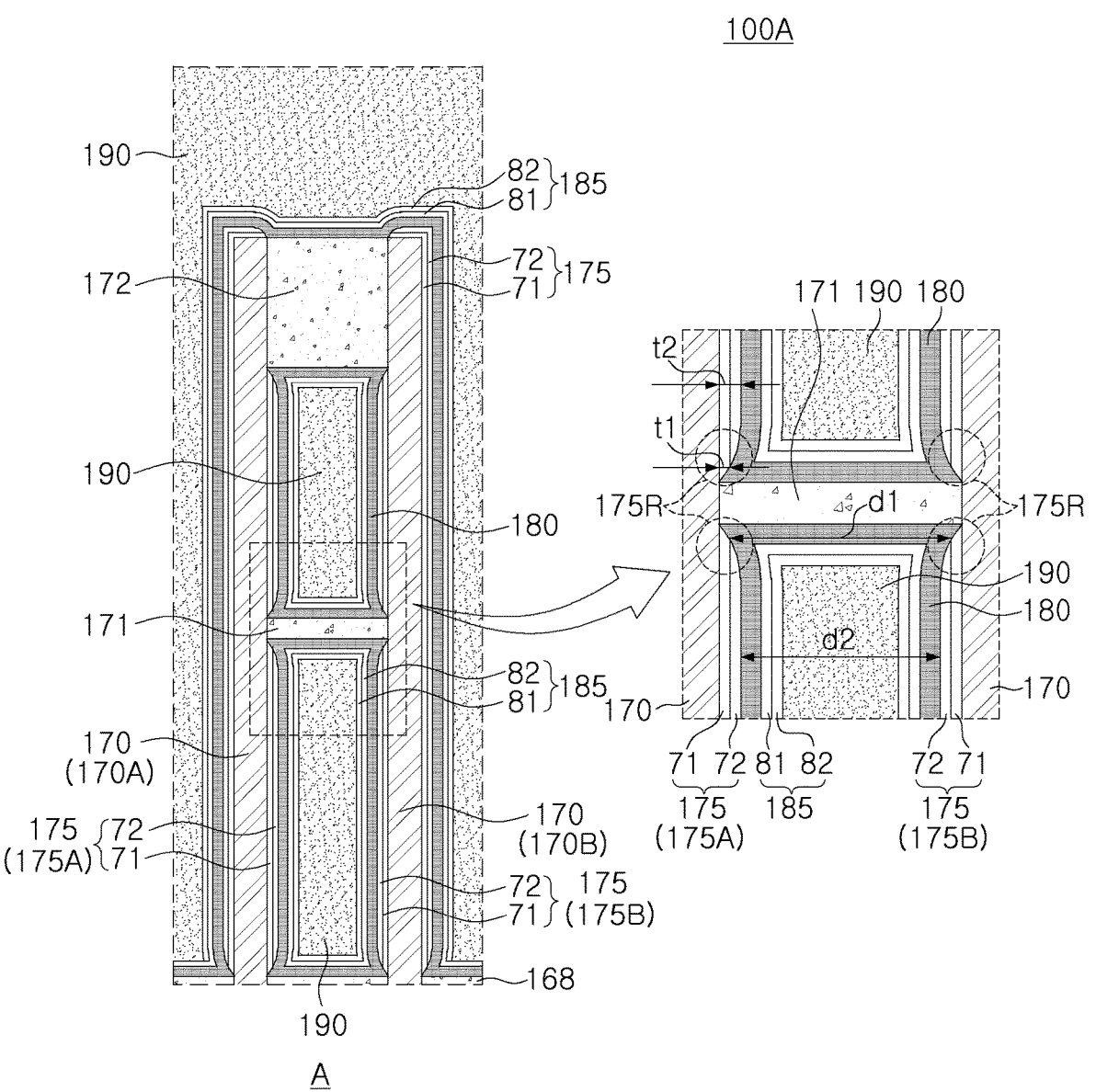
Figure 5:
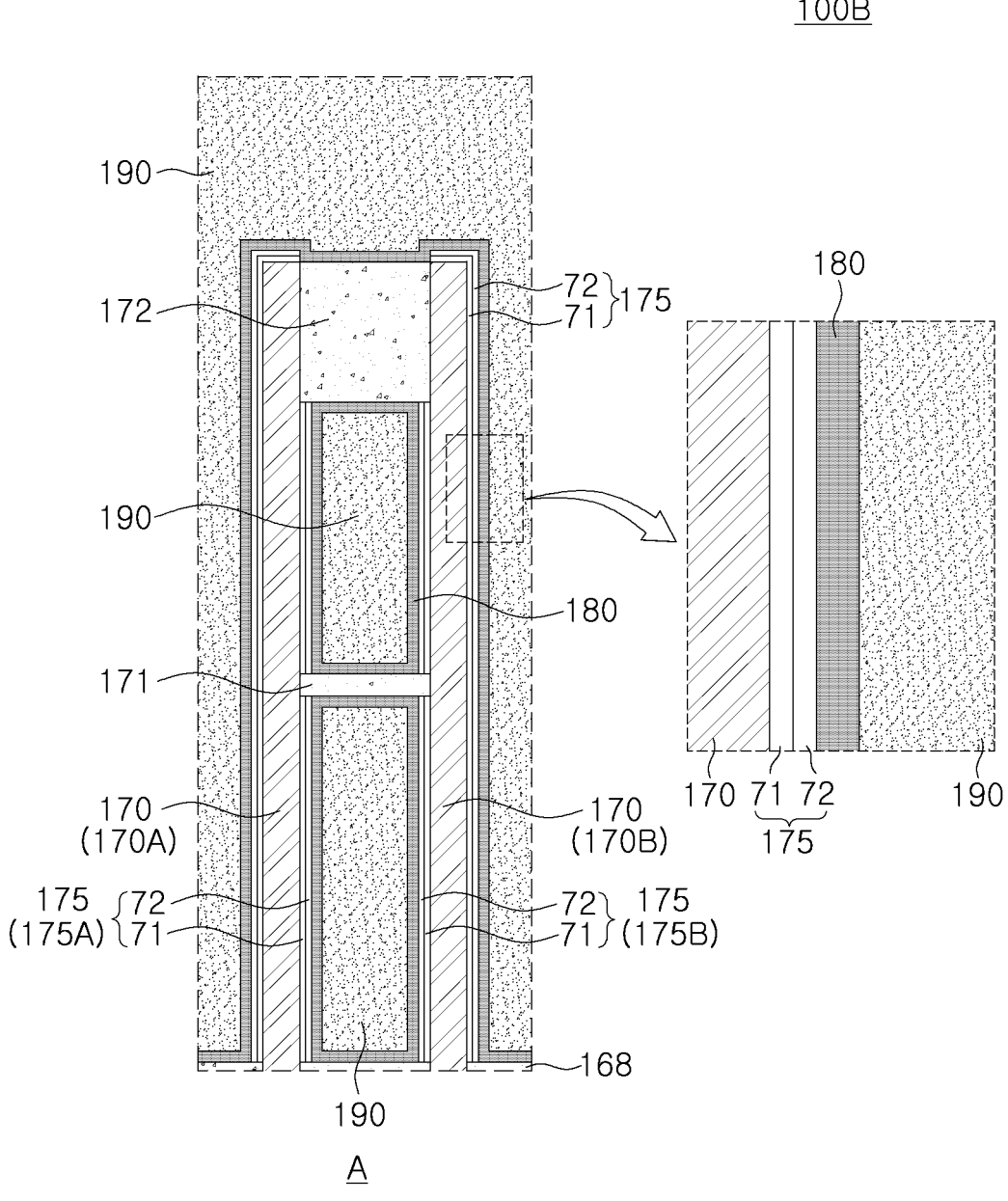
Figure 6:
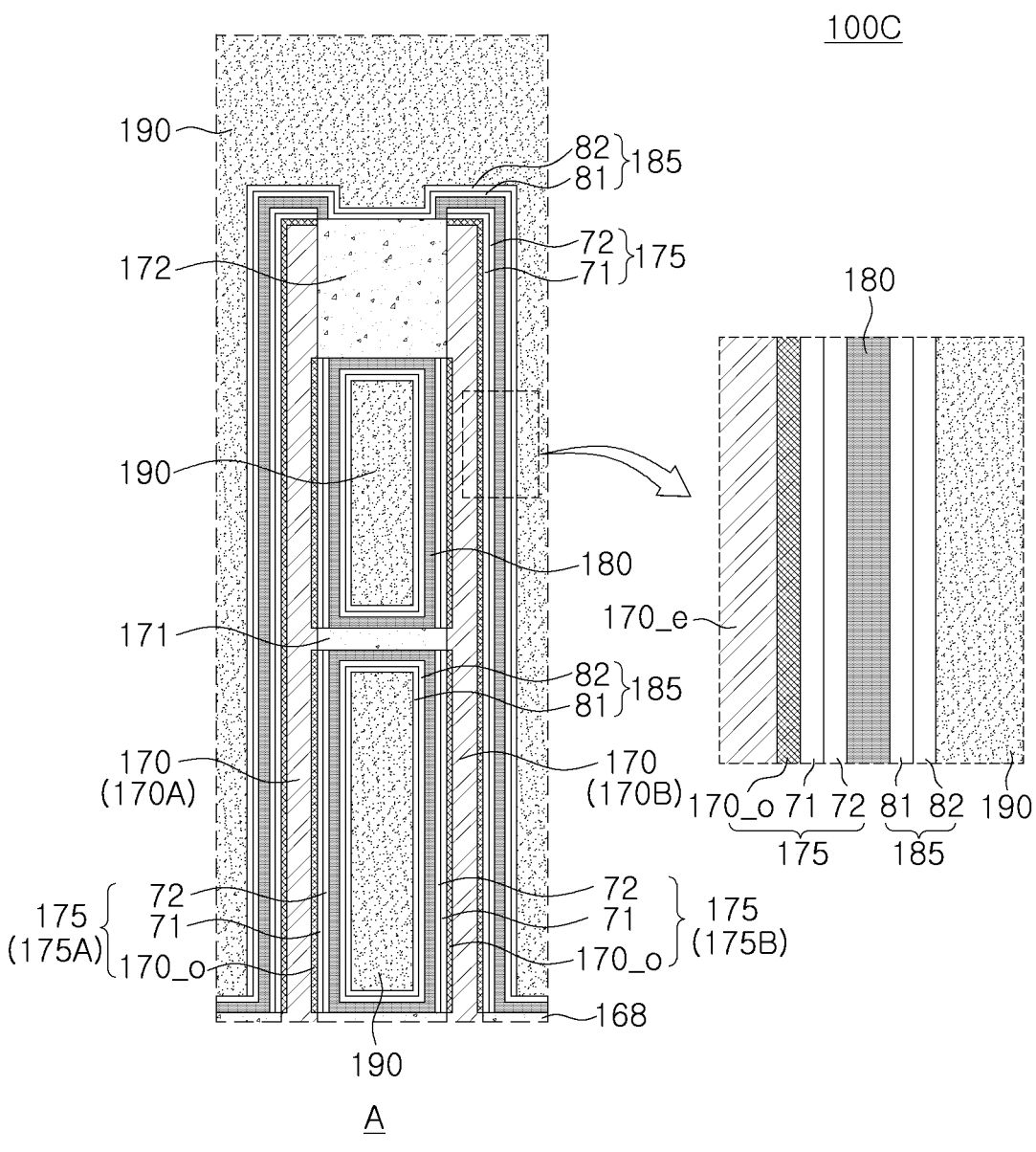

FIGS. 4 to 6 are partially enlarged cross-sectional views illustrating a region including a capacitor of a semiconductor device according to example embodiments. FIGS. 4 to 6 illustrate a region corresponding to region 'A' of FIG. 2.

Referring to FIG. 4, a first interfacial film 175 of a semiconductor device 100A may include a portion 175R of which a thickness decreases in a direction towards support layers 171 and 172. For example, the first interfacial film 175 may include a first region and a second region, wherein the second region is disposed closer to the support layers 171 and 172 than the first region In the first region, a first distance d1 between the first interfacial pattern 175A and the second interfacial pattern 175B may be greater than a second distance d2 between the first interfacial pattern 175A and the second interfacial pattern 175B in the second region. For example, a thickness t1 of the first interfacial film 175 in the first region may be less than a thickness t2 of the first interfacial film 175 in the second region. The first interfacial film 175 may have a side profile as shown in FIG. 4 between the first electrode pattern 170A and the second electrode pattern 170B, and the dielectric layer 180, the second interfacial film 185, and the upper electrode 190 may have a side surface corresponding to the side profile of the first interfacial film 175. For example, the dielectric layer 180 disposed between the first electrode pattern 170A and the second electrode pattern 170B may include a portion bent toward the lower electrodes 170. The first interfacial film 175 may also include a portion of which a thickness decreases in a direction towards the etch stop layer 168.

Referring to FIG. 5, a capacitor structure CAP of a semiconductor device 100B may not include a second interfacial film 185 on a dielectric layer 180, and an upper electrode 190 may be in contact with the dielectric layer 180. The first interfacial film 175 may include a portion in which a concentration of the second metal element decreases or a portion in which the thickness decreases in a direction towards the support layers 171 and 172 and the etch stop layer 168.

Referring to FIG. 6, in lower electrodes 170 of a semiconductor device 100C, an oxidation region 170_o oxidized inwardly from a surface adjacent to the first interfacial film 175 may be formed, and the oxidation region 170_o may form a portion of the first interfacial film 175 together with the plurality of layers 71 and 72. The oxidation region 170_o may include, for example, titanium oxide or titanium oxynitride, and a region 170_e except for the oxidation region 170_o of the lower electrodes 170 may include or may be formed of titanium or titanium nitride, but an example embodiment thereof is not limited thereto.

FIGS. 7 to 14 are cross-sectional views illustrating a method of manufacturing a semiconductor device according to example embodiments. FIGS. 7 to 14 illustrate a process of forming a capacitor structure positioned in region 'A' of FIG. 2.

First, referring to FIG. 2, an active region ACT may be defined by forming a device isolation layer 110 on a substrate 101. A device isolation trench may be formed in the substrate 101, and a device isolation layer 110 may fill the device isolation trench. In a plan view, the active region ACT may have an elongated bar shape extending in a direction oblique to an extension direction of the word line WL. Impurity regions may be formed above the active region ACT, by performing an ion implantation process using the device isolation layer 110 as an ion implantation mask. The active region ACT and the device isolation layer 110 may be patterned to form a gate trench 115. A pair of gate trenches 115 may cross the active region ACT, but an example embodiment thereof is not limited thereto. The impurity regions may also be separated by the gate trench 115 to form a first impurity region 105a and a second impurity region 105b.

The gate dielectric layer 120 may be formed on an inner surface of the gate trench 115 to have a substantially conformal thickness. Subsequently, a word line WL may be formed to fill at least a portion of the gate trench 115. An upper surface of the word line WL may be recessed to be lower than an upper surface of the active region ACT. A gate capping layer 125 may be formed on the word line WL by stacking an insulating layer on the substrate 101 to fill the gate trench 115 and etching the same.

An insulating layer and a conductive layer may be sequentially formed on a front surface of the substrate 101 and patterned to form a buffer insulating layer 128 and a first conductive pattern 141, sequentially stacked. The buffer insulating layer 128 may be formed of or may include at least one of silicon oxide, silicon nitride, and silicon oxynitride. A plurality of buffer insulating layers 128 may be formed to be spaced apart from each other. The first conductive pattern 141 may have a shape corresponding to a planar shape of the buffer insulating layer 128. The buffer insulating layer 128 may be formed to simultaneously cover end portions of two active regions ACT, adjacent to each other, that is, second impurity regions 105b, adjacent to each other. Bit line contact holes may be formed by etching upper portions of the device isolation layer 110, the substrate 101, and the gate capping layer 125 using the buffer insulating layer 128 and the first conductive pattern 141 as an etching mask. The bit line contact hole may expose the first impurity region 105a.

A bit line contact pattern DC filling the bit line contact hole may be formed. Forming the bit line contact pattern DC may include forming a conductive layer filling the bit line contact hole and performing a planarization process. For example, the bit line contact pattern DC may be formed of polysilicon. After sequentially forming a second conductive pattern 142, a third conductive pattern 143, and first to third capping patterns 146, 147, and 148 on the first conductive pattern 141, the first to third conductive patterns 141, 142, and 143 may be sequentially etched using the first to third capping patterns 146, 147, and 148 as an etching mask. As a result, a bit line structure BLS including the bit line BL including the first to third conductive patterns 141, 142, and 143 and the bit line capping pattern BC including the first to third capping patterns 146, 147, and 148 may be formed.

Spacer structures SS may be formed on side surfaces of the bit line structures BLS. The spacer structure SS may be formed of a plurality of layers. Fence insulating patterns 154 may be formed between the spacer structures SS. The fence insulating patterns 154 may include or may be formed of silicon nitride or silicon oxynitride. An opening exposing the second impurity region 105b may be formed by performing an anisotropic etching process using the fence insulating patterns 154 and the third capping pattern 148 as an etching mask.

A lower conductive pattern 150 may be formed below the opening. The lower conductive pattern 150 may be formed of a semiconductor material such as polysilicon. For example, the lower conductive pattern 150 may be formed by forming a polysilicon layer filling the opening and then performing an etch-back process.

A metal-semiconductor compound layer 155 may be formed on the lower conductive pattern 150. Forming the metal-semiconductor compound layer 155 may include a deposition process and a heat treatment process of a metal layer.

An upper conductive pattern 160 may be formed above the first opening. Forming an upper conductive pattern 160 may include sequentially forming a barrier layer 162 and a conductive layer 164. Thereafter, a patterning process may be performed on the barrier layer 162 and the conductive layer 164 to form insulating patterns 165 passing therethrough. Accordingly, a lower structure including the substrate 101, the word line structure WLS, and the bit line structure BLS may be formed.

Figure 7:
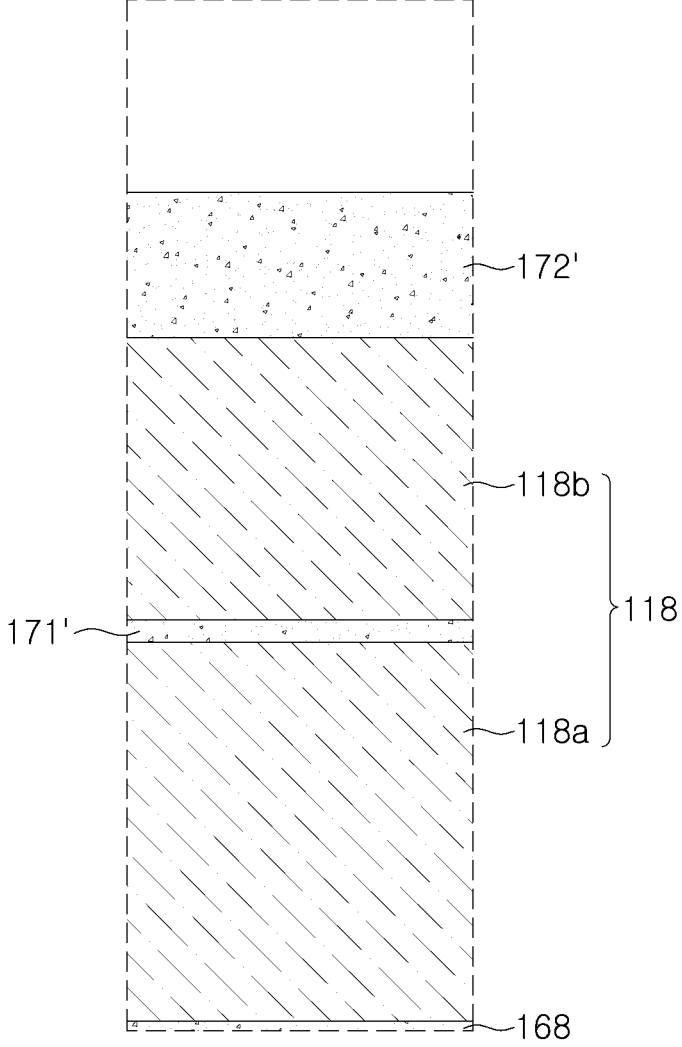
FIGS. 7 to 14 are cross-sectional views illustrating a method of manufacturing a semiconductor device according to example embodiments.

Next, referring to FIG. 7, an etch stop layer 168 may be conformally formed on the lower structure, and mold layers 118 and preliminary support layers 171' and 172' may be alternately stacked on the etch stop layer 168. The etch stop layer 168 may include or may be formed of an insulating material having etch selectivity under specific etch conditions, with the mold layers 118, for example, at least one of silicon oxide, silicon nitride, silicon carbide, silicon oxycarbide, and silicon carbonitride. The mold layers 118 may include a first mold layer 118a and a second mold layer 118b on the first mold layer 118a. The first preliminary support layer 171' may be formed between the first mold layer 118a and the second mold layer 118b, and the second preliminary support layer 172' may be formed on the second mold layer 118. For example, the mold layers 118 may be formed of silicon oxide, and the preliminary support layers 171' and 172' may be formed of silicon nitride.

Figure 8:
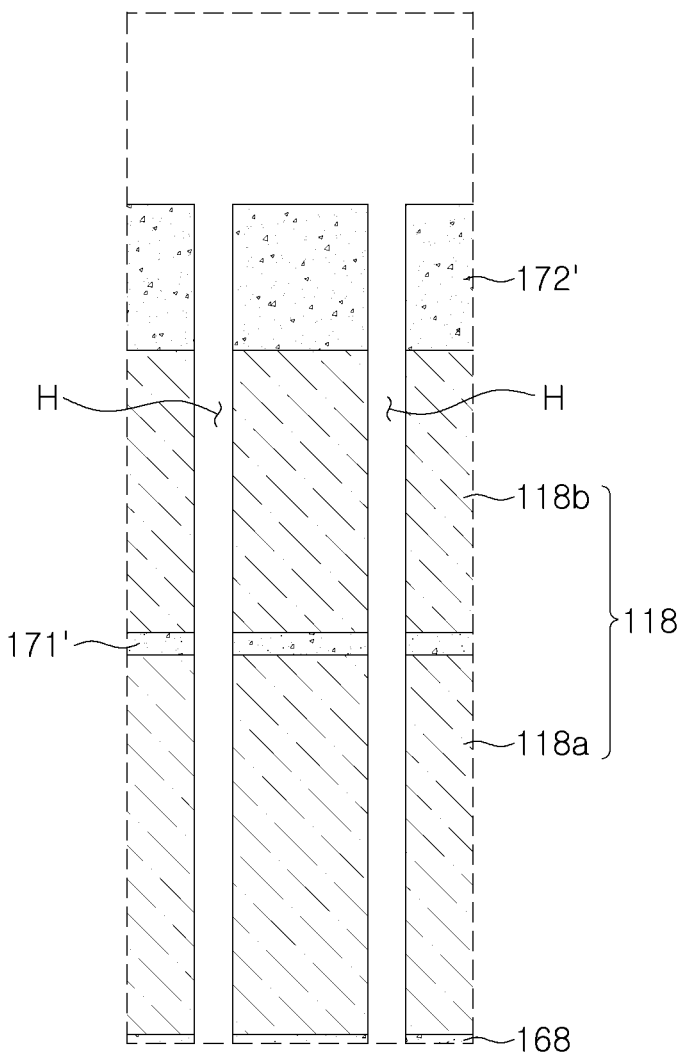

Referring to FIG. 8, a plurality of holes H passing through the mold layers 118 and the preliminary support layers 171' and 172' may be formed. In an operation of forming the plurality of holes H, an etch stop layer 168 may serve as a stopper stopping a progress of the etching process. The plurality of holes H may penetrate the etch stop layer 168 to expose upper conductive patterns 160. The plurality of holes H are regions in which lower electrodes 170 are to be formed, and as shown in FIG. 1, may be formed in a regular arrangement by being spaced apart from each other at predetermined intervals on a plane.

Figure 9:
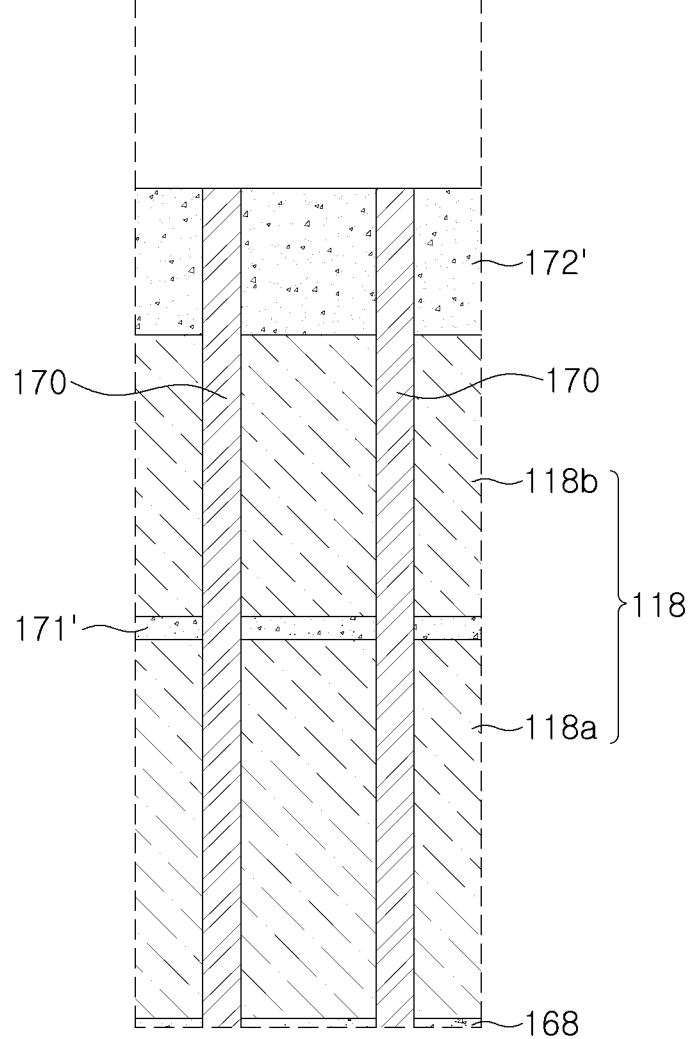

Referring to FIG. 9, lower electrodes 170 may be formed by filling a plurality of holes H with a conductive material. The lower electrodes 170 may be formed to be connected to the upper conductive pattern 160 at lower ends of the plurality of holes H. Forming the lower electrodes 170 may include forming a conductive material layer inside and on the plurality of holes H, and performing a planarization process for the conductive material layer, for example, chemical mechanical polishing (CMP) process. Thereby, the lower electrodes 170 may be formed in a plurality of patterns spaced apart from each other by node separation.

Figure 10:
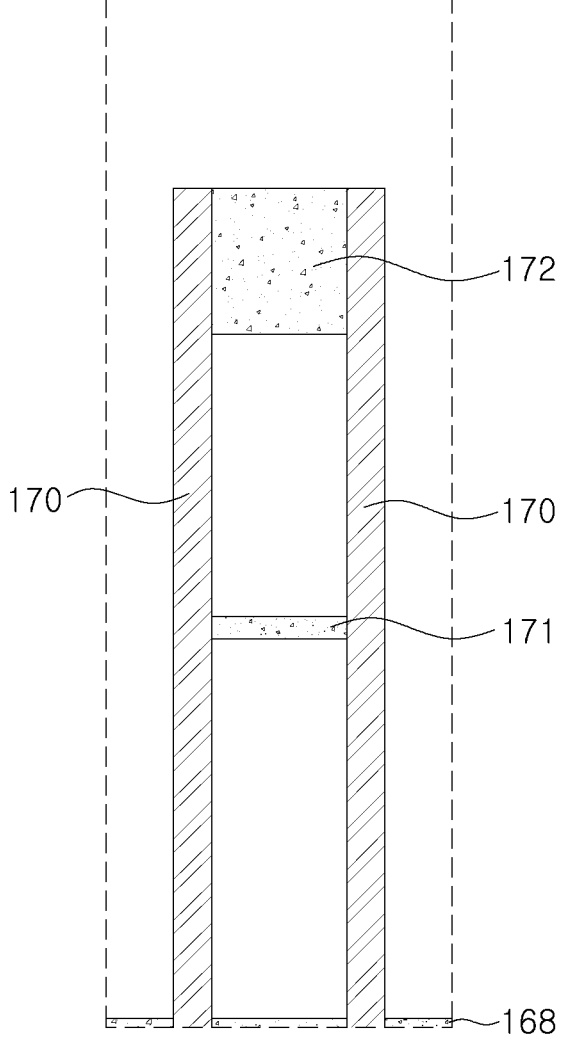

Referring to FIG. 10, a separate mask may be formed on a second preliminary support layer 172', and at least a portion of mold layers 118 and preliminary support layers 171' and 172' may be removed using the mask. Accordingly, the preliminary support layers 171' and 172' may be formed of support layers 171 and 172. The support layers 171 and 172 may be patterned according to a structure of the mask to have a shape including a plurality of openings. The support layers 171 and 172 may connect lower electrodes 170, adjacent to each other. The mold layers 118 may be selectively removed with respect to the support layers 171 and 172. The mask may be removed after etching the mold layers 118 or while etching the mold layers 118.

Figure 11:
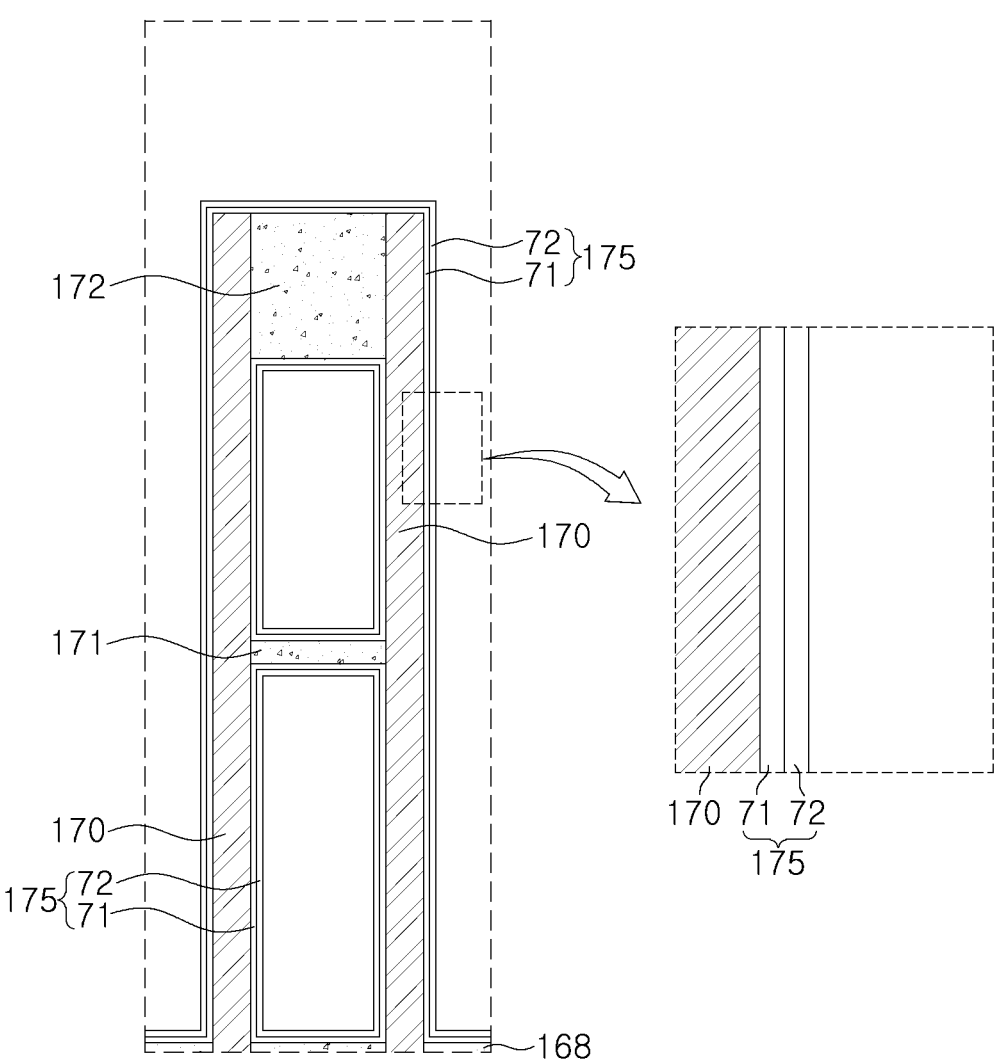

Referring to FIG. 11, a first interfacial film 175 may be conformally formed on the lower structures. The first interfacial film 175 may be formed of a plurality of layers 71 and 72, and the plurality of layers 71 and 72 may be formed by using at least one, for example, atomic layer deposition (ALD), chemical vapor deposition (CVD), or a doping process. The first interfacial film 175 may be formed to cover the lower electrodes 170, and may be formed to cover both the exposed upper and lower surfaces of the etch stop layer 168 and the support layers 171 and 172. While the first interfacial film 175 is formed, the lower electrodes 170 may also be partially oxidized from a surface thereof.

Figure 12:
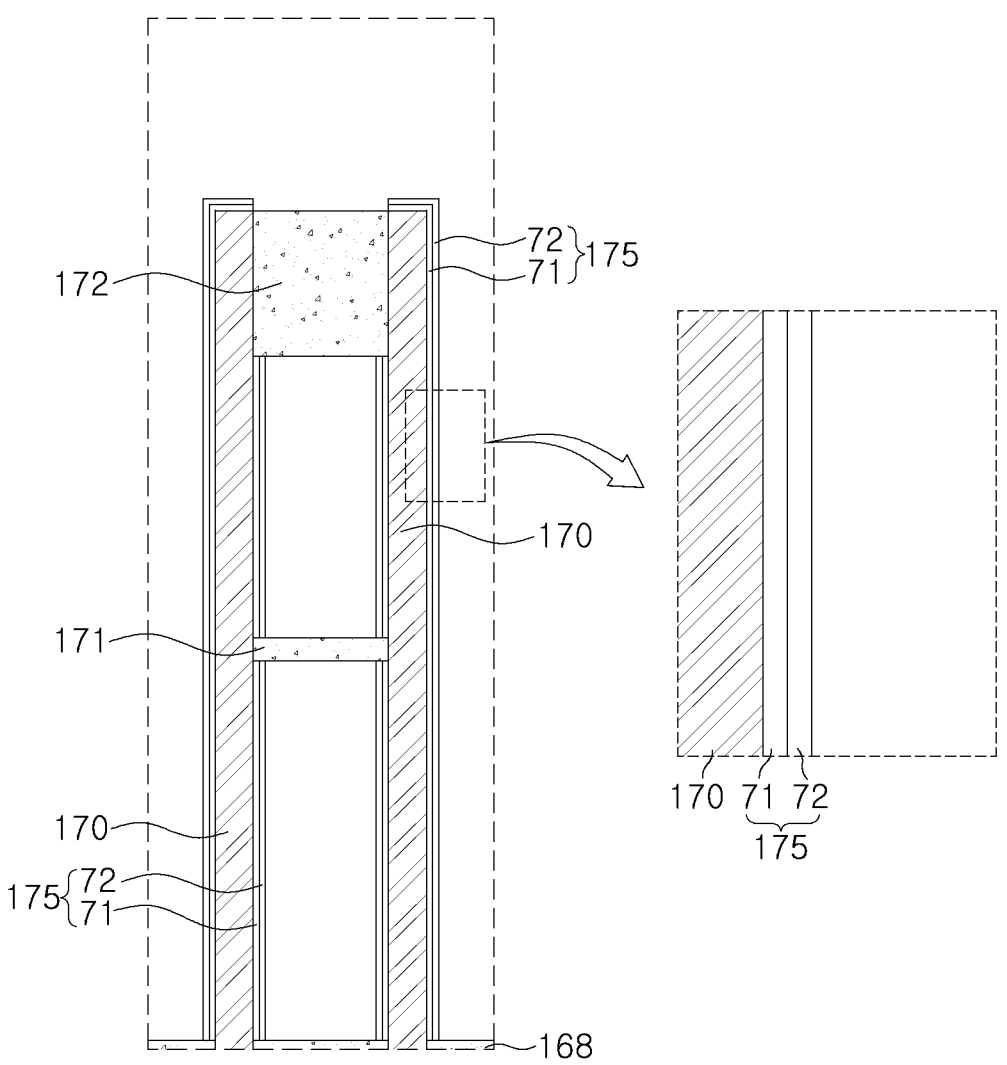

Referring to FIG. 12, a selective etching process may be performed on the first interfacial film 175. When the first interfacial film 175 is formed of a conductive material, adjacent lower electrodes 170 may be electrically connected to each other. For electrical separation of the lower electrodes 170, a portion among the first interfacial films 175, formed on support layers 171 and 172 and an etch stop layer 168 may be removed. The first interfacial film 175 is formed of a plurality of layers 71 and 72, and as already mentioned, since there is a difference in concentration of a metal element included in the first interfacial film 175, during a selective etching process, the first interfacial film 175 may be left on the lower electrodes 170 and may be selectively removed on the support layers 171 and 172 and the etch stop layer 168. In the present step, as described above, the first interfacial film 175 formed on the etch stop layer 168 may also be selectively and easily removed.

In one example, when the first interfacial film 175 is formed, energy capable of diffusing a metal element in the lower electrodes 170 or the first layer 71 may be required, and to this end, in the present step, plasma treatment, annealing treatment, ozone treatment, extreme ultraviolet treatment, and the like may be performed in-situ at the same time as the deposition of the first interfacial film 175. Alternatively, an ex-situ method in which energy is applied by performing the post-treatment process after depositing the first interfacial film 175 may also be performed.

In one example, the first interfacial film 175 may be formed to have a first thickness on the lower electrodes 170, a second thickness, lower than the first thickness on the support layers 171 and 172, and a third thickness, smaller than the first thickness and equal to or similar to the second thickness on the etch stop layer 168, so that the etching process may be performed to maintain the first interfacial film 175 only on only the lower electrodes 170.

Figure 13:
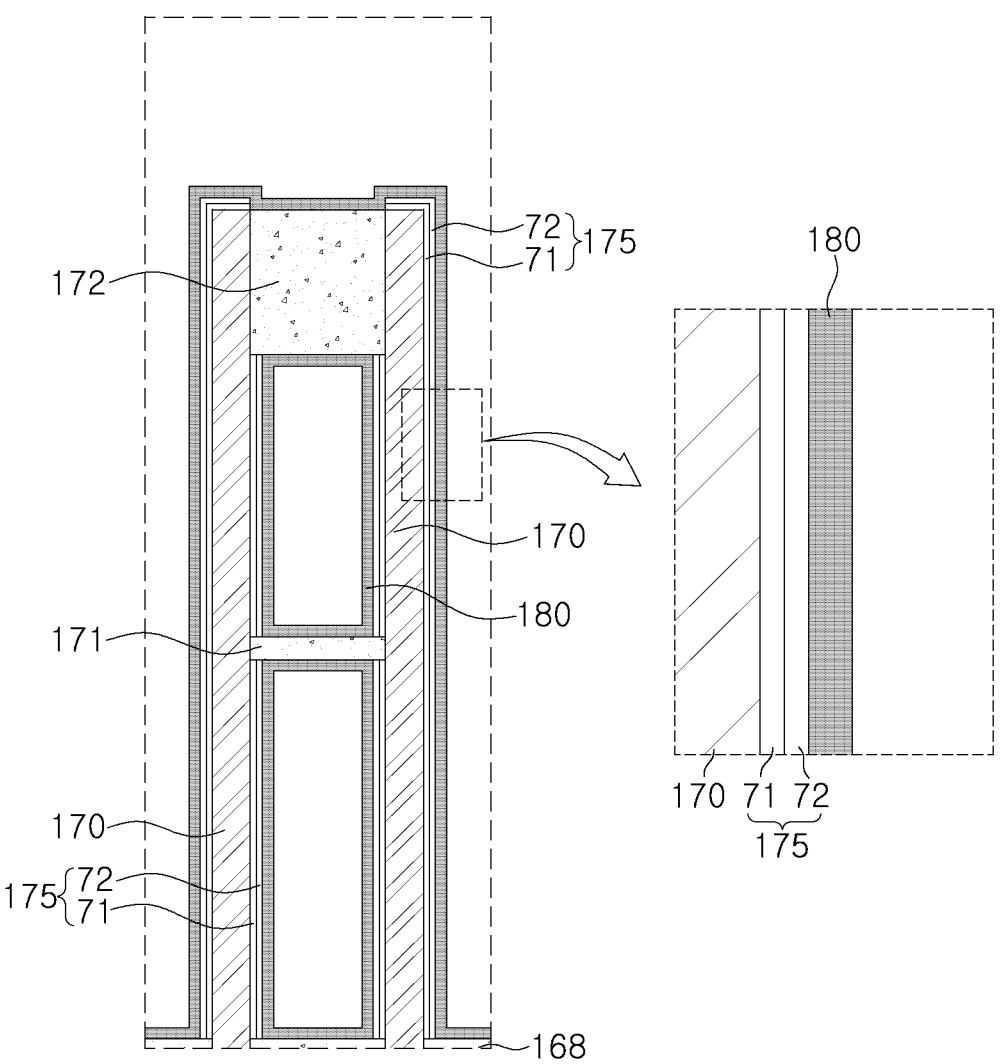

Referring to FIG. 13, after a selective etching process is performed, a dielectric layer 180 may be formed on a first interfacial film 175. The dielectric layer 180 may be conformally formed on the lower structure. The dielectric layer 180 may cover the first interfacial film 175, support layers 171 and 172, and an etch stop layer 168. In a process of forming the dielectric layer 180, at least one of constituent components of the dielectric layer 180, for example, hafnium (Hf) or zirconium (Zr) may diffuse into or move to the first interfacial film 175.

Figure 14:
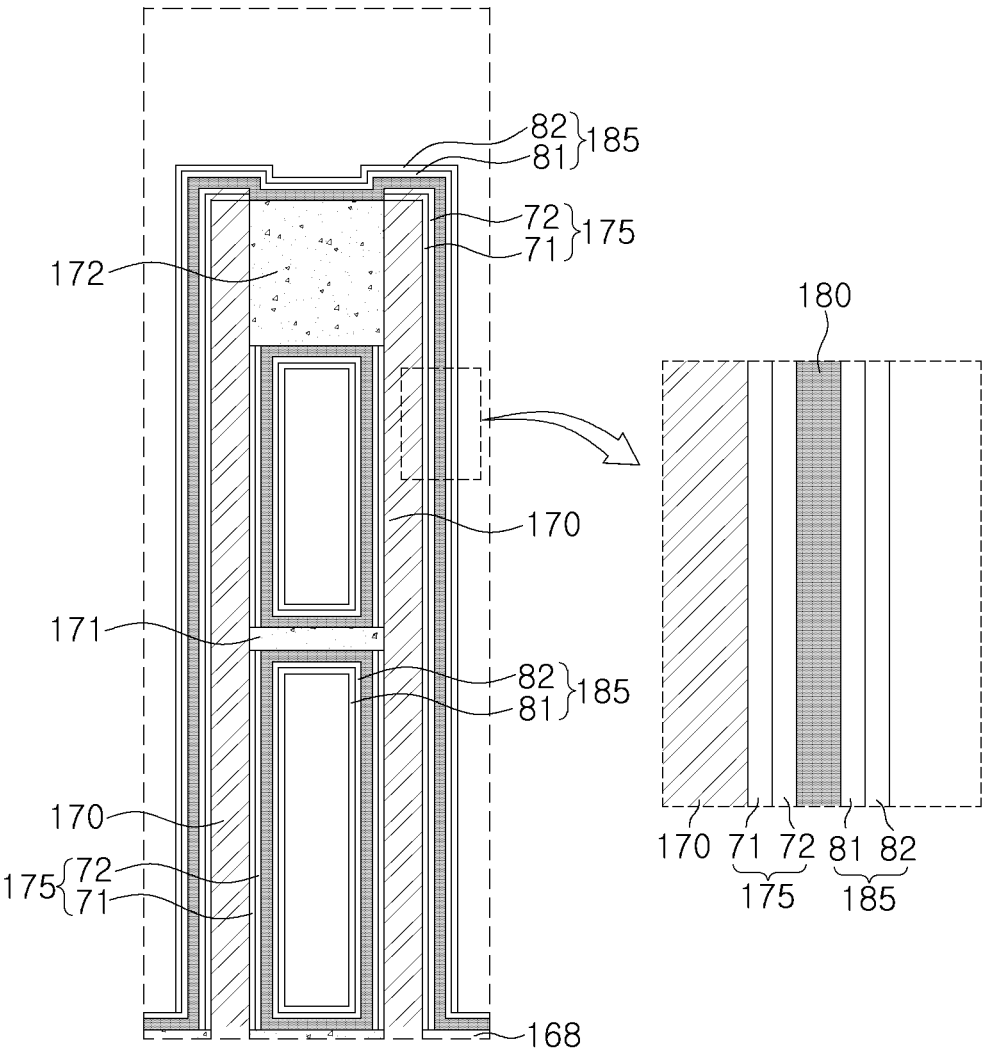

Referring to FIG. 14, a second interfacial film 185 may be formed on a dielectric layer 180. The second interfacial film 185 may be conformally formed on the lower structure. The second interfacial film 185 may cover the dielectric layer 180. The second interfacial film 185 may be formed of a plurality of layers 81 and 82, and the plurality of layers 81 and 82 may be formed using, for example, at least one of atomic layer deposition (ALD), chemical vapor deposition (CVD), or a doping process.

Next, referring to FIG. 3, an upper electrode 190 may be formed o the second interfacial film 185. Accordingly, a capacitor structure CAP including the lower electrodes 170, the dielectric layer 180, the upper electrode 190, and the first interfacial film 175 and the second interfacial film 185 may be formed on the lower structure, and a semiconductor device 100 including the same may be manufactured.

As set forth above, by respectively disposing multilayered interfacial films between the lower electrode of the capacitor and between the dielectric layer and the upper electrode and the dielectric layer, a semiconductor device having improved electrical characteristics and reliability may be provided.

While example embodiments have been shown and described above, it will be apparent to those skilled in the art that modifications and variations could be made without departing from the scope of the present inventive concept as defined by the appended claims.

What is claimed is:

1. A semiconductor device, comprising:

a substrate extending in a first direction and a second direction intersecting the first direction;

a plurality of lower electrodes on the substrate;

at least one support layer in contact with the plurality of lower electrodes and extending in the first direction, parallel to an upper surface of the substrate;

a dielectric layer on the plurality of lower electrodes;

an upper electrode on the dielectric layer;

a first interfacial film between the plurality of lower electrodes and the dielectric layer; and a second interfacial film between the upper electrode and the dielectric layer, wherein at least one of the first interfacial film and the second interfacial film includes a plurality of layers, wherein each of an upper surface and a lower surface of the at least one support layer includes a region spaced apart from the first interfacial film, wherein the plurality of layers include a first metal element and a second metal element different from the first metal element, and at least one of oxygen (O) and nitrogen (N), wherein the plurality of lower electrodes include the first metal element, wherein the first interfacial film includes a first region and a second region, the first region being more adjacent to the at least one support layer than the second region in a third direction perpendicular to the first and second directions, wherein, in the first region, the first interfacial film includes the second metal element at a first concentration, and

15 wherein, in the second region, the first interfacial film includes the second metal element at a second concentration different from the first concentration.

2. The semiconductor device of claim 1, wherein each of the first metal element and the second metal element is selected from any one of tin (Sn), molybdenum (Mo), niobium (Nb), tantalum (Ta), titanium (Ti), indium (In), nickel (Ni), cobalt (Co), tungsten (W), ruthenium (Ru), zirconium (Zr), and hafnium (Hf).

3. The semiconductor device of claim 1, wherein the first interfacial film comprises a plurality of first layers, and
wherein the second interfacial film comprises a plurality of second layers.

4. The semiconductor device of claim 3, wherein the plurality of first layers intermittently extend around the at least one support layer, and
wherein the plurality of second layers continuously extend around the at least one support layer.

5. The semiconductor device of claim 4, wherein the plurality of second layers comprise a portion extending in the first direction in a region adjacent to the at least one support layer.

6. The semiconductor device of claim 3, further comprising
an etch stop layer below the at least one support layer, and in contact with lower regions of side surfaces of the plurality of lower electrodes,
wherein the plurality of first layers extend in the third direction on an upper surface of the etch stop layer, but do not extend in the first direction along a surface of the at least one support layer in a region adjacent to the at least one support layer.

7. The semiconductor device of claim 1, wherein a thickness of a portion of the first interfacial film decreases in the first direction as the first interfacial film extends in the third direction towards the at least one support layer.

8. The semiconductor device of claim 1, further comprising
a plurality of word lines extending in the second direction on the substrate; and
a plurality of bit lines extending in the first direction on the substrate,
wherein the plurality of lower electrodes are disposed at a higher level in the third direction than the plurality of word lines and the plurality of bit lines.

9. A semiconductor device, comprising:
a substrate extending in a first direction and a second direction intersecting the first direction;
a plurality of lower electrodes on the substrate;
a support layer in contact with the plurality of lower electrodes and extending in the first direction parallel to an upper surface of the substrate;
a dielectric layer on the plurality of lower electrodes;
an upper electrode on the dielectric layer;
a first interfacial film between the plurality of lower electrodes and the dielectric layer; and
a second interfacial film between the upper electrode and the dielectric layer,
wherein at least one of the first interfacial film and the second interfacial film includes a plurality of layers, and
wherein a thickness of a portion of the first interfacial film decreases in the first direction as the first interfacial film extends in a third direction towards the support layer, the third direction perpendicular to the first and second directions.

10. The semiconductor device of claim 9, wherein the plurality of lower electrodes comprise a first electrode pattern and a second electrode pattern disposed adjacent to each other with the support layer therebetween, and
wherein the first interfacial film comprises a first interfacial pattern, in contact with the first electrode pattern, and a second interfacial pattern, in contact with the second electrode pattern.

11. The semiconductor device of claim 10, wherein the first interfacial pattern and the second interfacial pattern are spaced apart from each other.

12. The semiconductor device of claim 10, wherein the first interfacial film comprises a first region and a second region,
wherein the first region is disposed closer, in the third direction, to the support layer than the second region, and
wherein a first distance, in the first direction, between the first interfacial pattern and the second interfacial pattern in the first region is greater than a second distance, in the first direction, between the first interfacial pattern and the second interfacial pattern in the second region.

13. The semiconductor device of claim 9, wherein the plurality of lower electrodes comprise a first metal element,
wherein the first interfacial film comprises a second metal element different from the first metal element, and
wherein the first interfacial film comprises a portion of which a concentration of the second metal element decreases in the third direction towards the support layer.

14. The semiconductor device of claim 13, wherein the second metal element is niobium (Nb).

15. The semiconductor device of claim 9, further comprising
an etch stop layer below the support layer, and in contact with lower regions of side surfaces of the plurality of lower electrodes,
wherein a thickness of a portion of the first interfacial film decreases in the first direction as the first interfacial film extends in the third direction towards the etch stop layer.

16. A semiconductor device, comprising:
a device isolation layer defining active regions on a substrate extending in a first direction and a second direction intersecting the first direction;
gate electrodes across the active regions and extending into the device isolation layer;
first impurity regions and second impurity regions in the active regions on both sides of the gate electrodes;
bit lines on the gate electrodes, and electrically connected to the first impurity regions;
upper conductive patterns on side surfaces of the bit lines, and electrically connected to the second impurity regions;
lower electrodes extending in a third direction, perpendicular to the first and second directions, on the upper conductive patterns, and connected to the upper conductive patterns, the lower electrodes including a first electrode pattern and a second electrode pattern, adjacent to each other;
at least one support layer between the first electrode pattern and the second electrode pattern, and in contact with the first electrode pattern and the second electrode pattern;
an upper electrode on the lower electrodes;
a dielectric layer between the lower electrodes and the upper electrode;

a first interfacial film between the lower electrodes and the dielectric layer; and a second interfacial film between the upper electrode and the dielectric layer, wherein each of an upper surface and a lower surface of the at least one support layer includes a portion exposed from the first interfacial film and in contact with the dielectric layer, wherein at least one of the first interfacial film and the second interfacial film comprises a plurality of layers, wherein the lower electrodes, the upper electrode, the first interfacial film, and the second interfacial film include a first metal element in common, wherein the first interfacial film includes a second metal element, different from the first metal element, and wherein the first interfacial film includes a portion of which a concentration of the second metal element decreases in the third direction towards the at least one support layer.

17. The semiconductor device of claim 16, further comprising an etch stop layer below the at least one support layer, and in contact with lower regions of side surfaces of the lower electrodes, wherein the first interfacial film includes a portion of which a concentration of the second metal element decreases in the third direction towards the etch stop layer.

18. The semiconductor device of claim 17, wherein an upper surface of the etch stop layer comprises a portion, exposed from the first interfacial film and in contact with the dielectric layer.

19. The semiconductor device of claim 16, wherein the first metal element is titanium (Ti), wherein the second metal element is niobium (Nb), and wherein a portion of the first interfacial film is formed of niobium oxide.

20. The semiconductor device of claim 16, wherein the at least one support layer comprises a first support layer and a second support layer on the first support layer, wherein the lower electrodes comprise a first electrode pattern and a second electrode pattern disposed adjacent to each other with the first support layer and the second support layer interposed therebetween, wherein the first interfacial film comprises a first interfacial pattern, in contact with the first electrode pattern, and a second interfacial pattern, in contact with the second electrode pattern, and wherein the first interfacial pattern and the second interfacial pattern are disposed between the first support layer and the second support layer, and are spaced apart from each other.

\* \* \* \* \*